United States Patent [19]

Barber

[11] Patent Number: 4,627,030
[45] Date of Patent: Dec. 2, 1986

[54] DUAL PORT MEMORY WORD SIZE EXPANSION TECHNIQUE

[75] Inventor: Frank E. Barber, Center Valley, Pa.

[73] Assignee: AT&T Bell Laboratories, Murray Hill, N.J.

[21] Appl. No.: 698,076

[22] Filed: Feb. 4, 1985

[51] Int. Cl.$^4$ .............................................. G11C 7/00
[52] U.S. Cl. ...................................... 365/189; 365/230
[58] Field of Search ........................ 365/189, 230, 233

[56] References Cited

U.S. PATENT DOCUMENTS

| | | | |
|---|---|---|---|
| 4,016,541 | 4/1977 | Delagi et al. ......................... | 364/200 |
| 4,028,675 | 6/1977 | Frankenberg ......................... | 364/900 |
| 4,380,798 | 4/1983 | Shannon et al. ..................... | 364/200 |

OTHER PUBLICATIONS

"SY2130/SY2131 1024×8 Dual Port Random Access Memory", *Synerteck*, Mar., 1984, pp. 1–12.
"MCM68HC34 Dual-Port RAM Memory Unit", Motorola Semiconductors Products, Inc., 1984, pp. 1–9.
"Asynchronous Dual-Port RAM Simplifies Multiprocessor Systems", *EDN*, K. W. Pope, Sep. 1, 1983, pp. 147–154.
"WCM7804PX-24 Dual Port RAM", *AT&T Preliminary Data Sheet*, Mar. 1984, pp. 1–12.
"Memory Components-512×9 Biport TM Parallel In--Out FIFO MK4501/MK68345 N-12, 15, 20", *United Technologies Mostek*, 1983, pp. 1–12.

*Primary Examiner*—Joseph A. Popek
*Attorney, Agent, or Firm*—James H. Fox

[57] ABSTRACT

An improved technique for word size expansion using dual port random access memories (DPRs) allows multiple integrated circuit chips to be used without introducing erroneous data. A master chip provides a signal derived from its conflict resolution circuitry to one or more slave chips. This prevents one or more chips in a word size expansion arrangement from selecting opposite ports when two access requests arrive simultaneously. An optional address latch input to the chips allows the retention of the same address hold time parameter for the expanded word as for a single DPR chip.

5 Claims, 7 Drawing Figures

DUAL PORT MEMORY WORD SIZE EXPANSION TECHNIQUE

BACKGROUND OF THE INVENTION

1. Field of the Invention

The present invention relates to dual port memories adapted for interconnection to provide a data word larger than that provided by a single one of the memories.

2. Description of the Prior Art

A dual port random access memory (DPR) allows two input/output paths, referred to as "ports", to independently access data stored in a memory array. For example, referring to FIG. 1, a typical dual port memory provides for either of ports A or B to access data in the memory array. When an access is desired to perform a read or write function, the requesting port, say port A, signals the request by switching the enable input $\overline{EA}$ from a high to a low voltage level. This allows the input of address bits A1 ... An to address decoding circuitry, which selects which of the one or more memory locations are to be accessed. For example, if the memory is implemented as a "by 8" configuration, then 8 memory locations are accessed per request. The 8 data bits are then written into the memory array, or read from the memory array, depending upon the voltage level of the WEA (write enable A) input. A similar operation occurs when the B port requests access to the memory by changing the $\overline{EB}$ enable input from a high to a low voltage level. The enable inputs ($\overline{EA}$, $\overline{EB}$) are typically terminals of an integrated circuit.

It can be seen that a possibility of a conflict occurs when both ports A and B desire to access the memory array simultaneously. In some designs, this conflict, referred to as a "contention", occurs only when ports A and B desire to access the same memory locations at the same time. In other designs, the contention occurs whether the desired locations are identical or not. To resolve the contention, there has been provided circuitry to determine which of ports A and B requested the access first; that is, which of the enable inputs $\overline{EA}$ and $\overline{EB}$ made the first high to low transistion. Depending on the outcome of the contention resolution, one of the memory select lines (CE1P, CE2P) is activated, allowing either port A or port B to first communicate with the memory array.

For example, assume that a contention arises, and that port A is selected to have access first; i.e., to have "priority". Then, an internal memory cycle is initiated, and the 8 bits of data are transferred in or out of the memory via the I/O lines associated with the A port. Next, the other port (B) is allowed access to the memory array during the next internal memory cycle. The two internal memory cycles comprise the external memory cycle seen by the user. In other designs the DPR chip merely signals a "busy" signal to one of the ports when a contention arises. The contention is detected in one prior art technique by comparing the memory addresses supplied to the two ports; a contention is signalled when the addresses on both ports are identical. It is then up to the external circuity to delay the input/output operation from one port until the other port is finished with its access operation.

In many situations it is desired to access simultaneously more memory locations than provided by a single memory array. For example, if a by 8 memory is implemented on an integrated circuit chip, it may be desired to expand the I/O path to 16 bits, for use with a 16 bit microprocessor. Then, 2 of the chips could be combined for this purpose, as shown in FIG. 2, with each chip shown in more simplified form than in FIG. 1. Note that the memory enable inputs $\overline{EA}$ and $\overline{EB}$ could be connected together, and the input/output lines for a given port merged into one (16 bit) bus for that port. That is, port A then includes the A port I/O lines of DPR #1, as well as the A port I/O lines of DPR #2. The B port is similarly comprised of the I/O lines of the B ports of each DPR. Additional chips may be similarly added, for use with 32 bit microprocessors, etc. The provision of one (or more) parity bits is also known in a DPR, so that "by 9" DPRs are utilized, with other sizes being possible.

SUMMARY OF THE INVENTION

I have invented a dual port memory having improved capabilty for expanding the number of memory locations that may be simultaneously accessed. In this technique, a "master" dual port memory is adapted to control at least one "slave" memory. The control is obtained by contention resolution circuitry on the master memory providing control outputs adapted to being coupled to port access request means on the slave memories. In this manner, the possibility of garbled data due to differing contention resolutions among the two or more memories is avoided.

DETAILED DESCRIPTION

The following detailed description relates to a dual port memory having an improved capability for interconnection to form an expanded data word. Each of the dual port memories is typically implemented as a discrete integrated circuit "chip". However, it will be recognized that the present technique also proves for interconnection of dual port memories implemented on different portions of a wafer scale integrated circuit.

Figure 1:
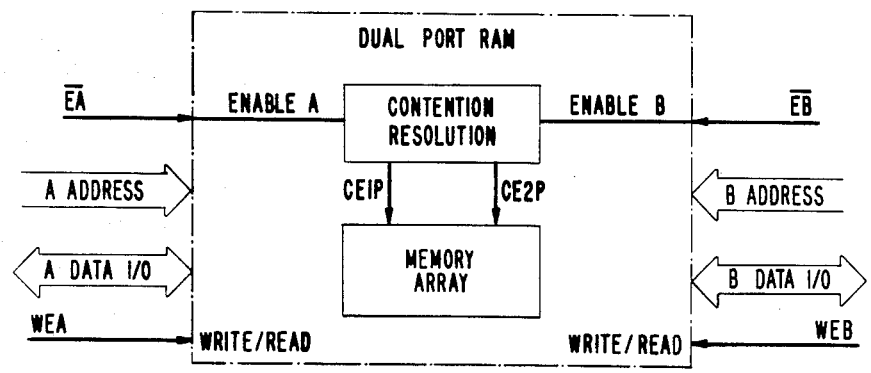
FIG. 1 shows a conventional dual port memory design.
Figure 2:
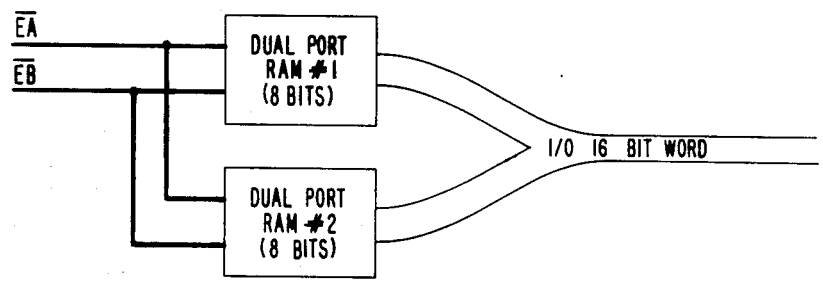
FIG. 2 shows a technique for interconnecting two or more dual port memories for expanding the word size.

The present invention results from the recognition that the technique for word size expansion shown in FIG. 2 introduces the possibility of erroneous (i.e., "garbled") data from being written into, or read out of, the memories. There errors will result when one of the memories resolves a contention in favor of one port, and another of the memories resolves the same contention in favor of the other port.

For example, for FIG. 2, consider the case wherein both ports A and B simultaneously request a write operation to the same word location. Consider further that the top dual port RAM (DPR #1) selects port A to have access first, whereas DPR #2 selects the B port. Then, the 16 bit word written into the memory will have 8 bits specified by port A, and 8 other bits specified by port B. Hence, the integrity of the 16 bit word will be lost, and a subsequent read operation to the word location will retrieve garbled data. Note that the possibility of garbled data increases as the access requests from the two ports become more nearly simultaneous. For example, in current designs, access requests separated by 5 nanoseconds or more have a very high probability of being resolved in the same manner by both DPRs. In that case, no garbling of data occurs. However, requests separated only a few picoseconds are much more likely to result in garbled data, since the randomness of the conflict resolution typically increases exponentially with the inverse of the time difference between the two access requests. There are numerous applications where the large number of memory requests and the importance of preserving data integrity make the potential for error a significant limitation on the reliability of a system.

Figure 3:
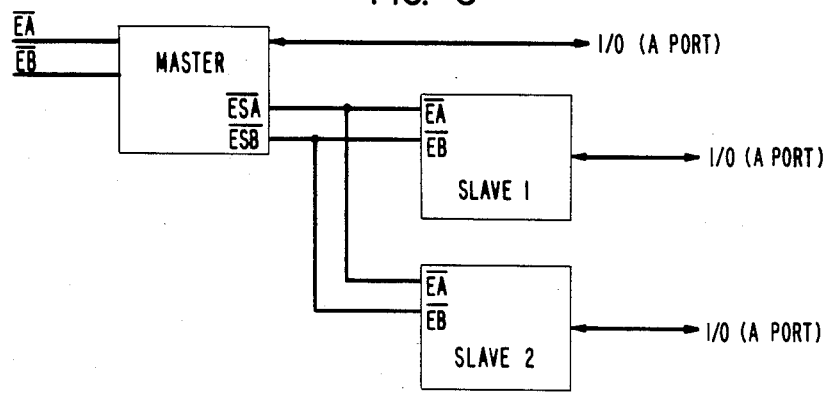
FIG. 3 shows dual port memories interconnected by the inventive technique.

The present technique solves this problem by providing that a single contention resolution circuit determines the priority of the accesses for all of the DPRs that are interconnected to form an expanded word. Referring to FIG. 3, a "master" DPR chip receives the access requests on the enable inputs $\overline{EA}$ and $\overline{EB}$, and provides the control signals $\overline{ESA}$, $\overline{ESB}$ to the "slave" DPR chips. The control signals are derived from the contention resolution circuitry on the master chip, which provides that either the $\overline{ESA}$ or $\overline{ESB}$ control output is first activated; for example, by switching from a high to a low voltage state. The activation of the selected $\overline{ESA}$ or $\overline{ESB}$ control output is separated in time sufficiently from any possble activation of the other control output so that the slave chips are ensured of all selecting the same port as the master chip. To this end, note that all of the enable inputs ($\overline{EA}$, $\overline{EB}$) of the slave chips are connected to the corresponding control outputs ($\overline{ESA}$, $\overline{ESB}$) of the master chip. The duration that the control outputs remain activated (e.g., low) is also sufficient to ensure that the slave chips have sufficient time to complete their internal memory cycles for both ports, as discussed further below. Normally, all of the chips are provided during manufacture with the control outputs ($\overline{ESA}$, $\overline{ESB}$), with an arbitrary one of the chips selected by the user to be the master, and the others to be the slaves. (For clarity of illustration, only the I/O outputs for the A ports are indicated in FIG. 3; however, I/O outputs for the B ports are similarly provided for each DPR.)

Figure 4:
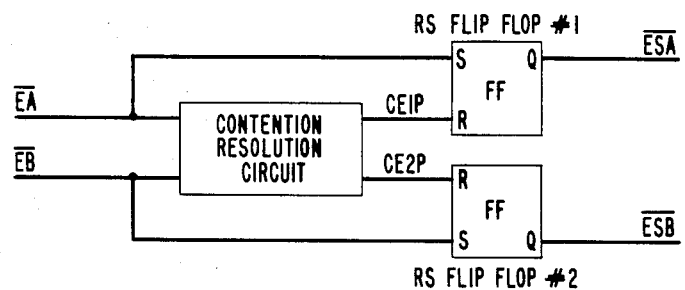
FIG. 4 shows circuitry suitable for implementing the inventive technique.
Figure 5:
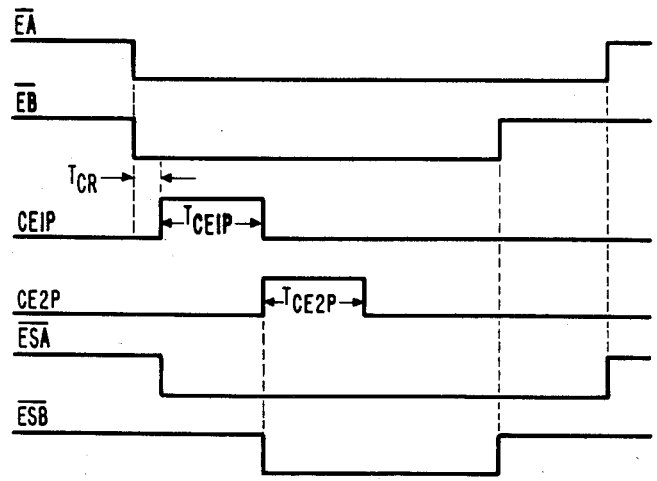
FIG. 5 shows timing diagrams for signals associated with the inventive technique.

A circuit suitable for implementing this function is shown in FIG. 4. The $\overline{EA}$ and $\overline{EB}$ inputs are provided to the contention resolution circuit, as before. In addition, those inputs are provided to the "set" inputs of R-S flip-flops #1 and #2 as shown. The outputs of the contention resolution circuit, CE1P and CE2P are provided to the "reset" inputs of these flip-flops, respectively. The "Q" outputs thereof provide the $\overline{ESA}$ and $\overline{ESB}$ signals. This circuit operates illustratively as follows: a high $\overline{EA}$ input unconditionally sets flip-flop #1 to produce a high Q output level, and hence a high $\overline{ESA}$ level. Similarly, a high $\overline{EB}$ level produces a high $\overline{ESB}$ level. A high to low transition on both of the enable inputs $\overline{EA}$, $\overline{EB}$ removes the set signal on both of the flip-flops and starts the contention circuit operation. Assuming the contention resolution circuit gives priority to the A port, the CE1P signal then undergoes a low to high transition; see FIG. 5. This transition occurs after a delay referred to as the contention resolution time, $T_{CR}$, which is typicaly a function of how nearly simultaneously the $\overline{EA}$ and $\overline{EB}$ transitions occurred. The CE1P transition initiates an A port memory cycle, and also resets flip-flop #1, causing a high to low transition on the $\overline{ESA}$ line (FIG. 5). This ensures that all of the slave chips also give priority to the A port request as noted above. (A similar operation obtains the selection of the B port if the master chip resolves a contention in its favor.)

When the internal (A port) cycle ends after a period of $T_{CE1P}$, the CE1P signal returns to a low voltage state. However, the $\overline{ESA}$ signal remains low until flip-flop #1 is set by a low to high transition on the EA input. Note that this may be provided for by a specification for the chip that requires the user to maintain an input signal (e.g., $\overline{EA}$) low for a certain minimum time. This minimum time, $T_{EL}$ (min) is approximated by the maximum internal cycle time specification for port A, $T_{CE1P}$(max), plus that for port B, $T_{CE2P}$(max) plus the maximum time required to resolve conflicts satisfactorily, $T_{CR}$ (max). An analogous situation exists for the B port and flip-flop #2. Note that in practice, the internal cycle times for the ports, $T_{CE1P}$ and $T_{CE2P}$ will be approximately equal for a given chip, but will vary from chip to chip depending upon processing conditions used in making the chips. For example, cycle times ranging from about 25 to 70 nanoseconds are typical in one current design.

Then, the foregoing technique provides that the low-going edges of the control signals ($\overline{ESA}$, $\overline{ESB}$) are separated by at minimum the internal cycle time of a DPR chip processed with the fastest possible characteristics and operating under the fastest conditions. This separation is more than sufficient to guarantee proper slave chip operation. Also, the foregoing technique ensures that the $\overline{ESA}$ or $\overline{ESB}$ control signal remains low long enough to allow the slave DPR chips to complete both their A port and B port cycles. This is true even if the slave chips have been processed with slow characteristics and are operated under the slowest conditions. Thus, this scheme eliminates speed considerations from the DPR word size expansion technique.

While as discussed above, enable signals may be provided to two input terminals ($\overline{EA}$, $\overline{EB}$) to a DPR chip, it is alternately possible to provide this function from address transition detectors. That is, additional circuitry in the DPR may be used to recognize when an access request has occurred to either port, by detecting the memory address bits applied thereto. This circuitry may then be used to provide a signal to the contention resolution circuit to determine which port (A or B) gets priority in the case of simultaneous requests. The present technique of controlling one or more slave chips may be used in that case also. In that case, the flip-flops (FIG. 4) may have their set inputs connected to the address transition circuitry. Other types of control logic cicuitry may be used in practicing the present invention, with the R-S flip-flops being illustrative of a preferred embodiment.

Another feature of the present technique is the optional inclusion of means to latch the memory address information into the slave chips from the enable inputs ($\overline{EA}$, $\overline{EB}$) of the master chip. That is, in normal (single chip) DPR operation, in the case of a write cycle, the input data, memory address, and write enable signals are strobed and latched on the falling edge of the enable signal applied to the enable inputs ($\overline{EA}$ or $\overline{EB}$). The user then must meet specified setup and hold times for the input information with respect to the enable signal. For example, the setup time may be specified at 0 nanoseconds, meaning that all the input information must be valid when the enable signal transitions low. The hold time may be specified at 20 nanoseconds, meaning that the input information must be held valid at least that long after the enable low transition. Then, when the DPR is used as a slave device in the above word size expansion technique (FIG. 3), the enable input for the device is then derived from the master DPR. This derived enable signal ($\overline{ESA}$ or $\overline{ESB}$) is delayed with respect to the system enable input ($\overline{EA}$ or $\overline{EB}$) by as much as an internal DPR cycle time, plus the contention resolution time. This delay must be recognized by the user and accounted for. The effect is to lengthen the hold time requirement by the maximum possible additional internal delay. For example, the hold time specification may increase to 115 nanoseconds. This is especially significant for the address input hold parameter, to which a system is usually most sensitive.

Figure 6:
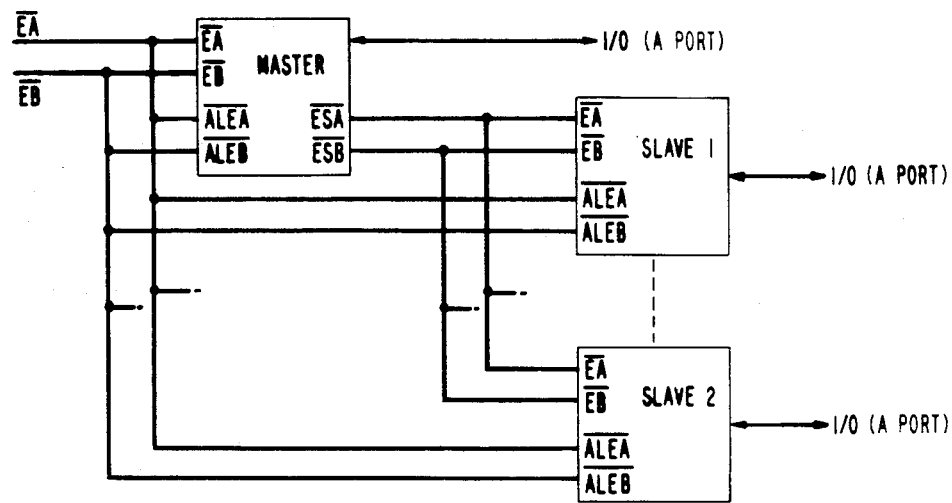
FIGS. 6 and 7 show alternative schemes for interconnecting memories of the inventive technique having an optional address latch capability.
Figure 7:
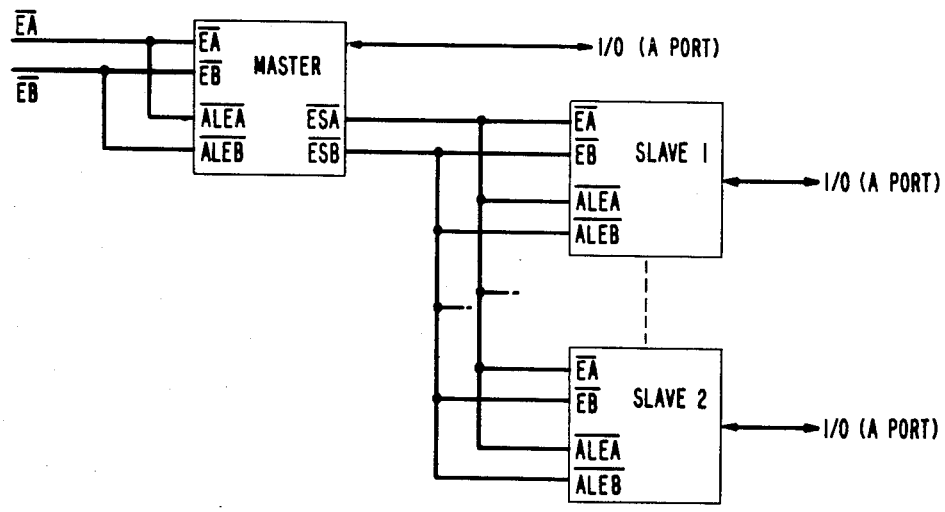

The use of separate address latch enable inputs ($\overline{ALEA}$, $\overline{ALEB}$), which operate independently of the enable inputs, allow the user to configure the DPRs in the word size expansion technique and still maintain the original hold time specification for the address inputs on the slave DPRs. This configuration is shown in FIG. 6. With this optional technique, the address information is latched in both the master and slave DPRs with the system enable inputs ($\overline{EA}$, $\overline{EB}$). This maintains the short hold time specification with respect to the address inputs. Note that the ALEA and ALEB inputs may alternately be connected to the $\overline{EA}$ and $\overline{EB}$ inputs for the slave chips; see FIG. 7. This simplifies wiring in some cases, but at the cost of additional address hold time, as noted above. Note again that only the A port I/O outputs are illustrated in FIGS. 6 and 7, but the B port I/O's are similarly provided.

What is claimed is:

1. An integrated circuit dual port memory comprising a memory array, a first port and a second port for communicating with said array, a first enable input means for requesting access to said memory array for said first port, a second enable input means for requesting access to said memory array for said second port, and conflict resolution means to select one of said first and second ports for said communicating characterized in that said integrated circuit further comprises control output means adapted to connect to enable input means of a slave dual port memory and to ensure that the same port of said slave dual port memory is selected as the selected port of said dual port memory.

2. The integrated circuit of claim 1 wherein said control output means comprises a first logic circuit connected to said first enable input means and a first output of said conflict resolution means, and a second logic circuit connected to said second enable input means and a second output of said conflict resolution means.

3. The integrated circuit of claim 2 wherein sad first and second logic circuits are flip-flop circuits.

4. The integrated circuit of claim 1 further comprising latch input means adapted to latch an address applied to said dual port memory upon the application of a latch enable signal to said latch input means.

5. The integrated circuit of claim 1 wherein said first and second enable input means comprise a terminal of said integrated circuit connected to said conflict resolution means.

* * * * *